United States Patent
Koh et al.

[11] Patent Number: 5,855,683
[45] Date of Patent: Jan. 5, 1999

[54] THIN FILM DEPOSITION APPARATUS

[75] Inventors: Seok Keun Koh; Hong Kyu Jang; Hyung Jin Jung; Won Kook Choi, all of Seoul, Rep. of Korea

[73] Assignee: Korea Institute of Science and Technology, Seoul, Rep. of Korea

[21] Appl. No.: 797,255

[22] Filed: Feb. 7, 1997

[30] Foreign Application Priority Data

Jul. 18, 1996 [KR] Rep. of Korea .................. 1996 28938

[51] Int. Cl.$^6$ .................................................. C23C 16/00
[52] U.S. Cl. .................................. 118/723 CB; 118/726; 204/298.04
[58] Field of Search ...................... 118/723 VE, 723 CB, 118/723 EB, 726; 204/298.04, 298.05; 315/111.81

[56] References Cited

U.S. PATENT DOCUMENTS

| 4,197,814 | 4/1980 | Takagi et al. | 118/726 |
| 4,805,555 | 2/1989 | Itoh | 118/719 |
| 5,100,526 | 3/1992 | Ito | 204/298.05 |
| 5,211,994 | 5/1993 | Tsukazaki et al. | 427/523 |
| 5,354,445 | 10/1994 | Ito et al. | 204/298.05 |

FOREIGN PATENT DOCUMENTS

| 60-158619 | 8/1985 | Japan | 118/723 CB |
| 63-224215 | 9/1988 | Japan | 118/723 CB |
| 1-279751 | 11/1989 | Japan | 118/723 CB |

*Primary Examiner*—Robert M. Kunemund
*Assistant Examiner*—Jeffrie R Lund
*Attorney, Agent, or Firm*—Pennie & Edmonds LLP

[57] ABSTRACT

An improved thin film deposition apparatus which is capable of easily increasing the temperature of a crucible using low electric power, for thus reducing the maintenance cost of the system, and fabricating a thin film having a constant characteristic by using a lower current density variation based on a distance, for thus increasing the reliability of a thin film device, whereby it is possible to fabricate a more compact product and to more easily maintain the system, which includes a heat shielding cylindrical chamber, a cylindrical chamber located within the heat shielding cylindrical chamber, a crucible section including a crucible and a heat filament arranged at an inner and lower portion of the cylindrical chamber, an ionization section having an anode and an ionization filament arranged in an upper portion inside the cylindrical chamber, and a magnet for enhancing an ionization efficiency, an upper and lower filament support for supporting the heater filament and the ionization filament, an upper and lower flange, to which the upper and lower filaments are fixed, arranged in the cylindrical chamber in order for the upper and lower filaments to be detachable, and a grounding plate extended from the heat shielding plate and the electromagnetic field blocking cylindrical chamber located at the upper direction of the crucible section and forming of an acceleration electrode system together with the upper flange.

10 Claims, 14 Drawing Sheets

PRIOR ART

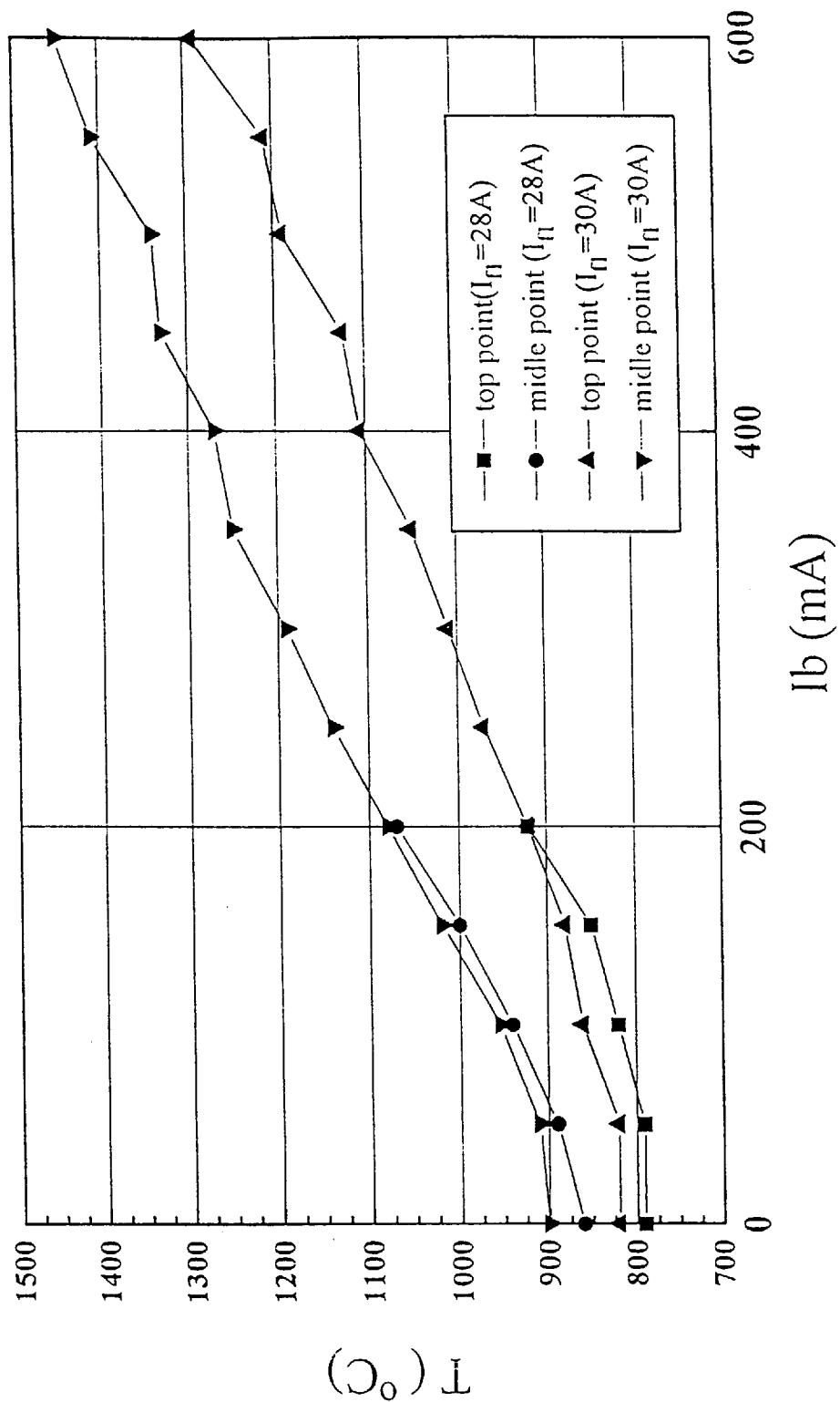

THIN FILM DEPOSITION APPARATUS

BACKGROUND OF THE INVENTION

1. Field of the Invention

The present invention relates to a thin film deposition apparatus, and particularly to an improved thin film deposition apparatus which allows easy increasing of the temperature of a crucible by using low electric power, for thus reducing the maintenance costs of the apparatus, and which can be used to fabricate a uniform thin film because there is very little variation of density of the manufactured thin film device, whereby the thin film deposition apparatus has a compact structural design which allows easy maintenance and repair.

2. Description of the Conventional Art

Recently, as technology advances, products have become lighter and smaller in size.

As common methods for fabricating a light and small-sized product, a vacuum deposition method directed to depositing metal atoms which are neutral state under a vacuum, an ion plating method, a sputtering method, a chemical vacuum deposition (CVD) method, etc. are used.

However, in the vacuum deposition method, since the metal in neutral state is attached to the substrate by means of only a thermal energy, the adhesive force of the metal with respect to the substrate is very weak. The ion plating method has a better adhesive force compared to the vacuum deposition method; however, the quality of the thin film is degraded. In the sputtering method, the composition ratio of the thin film disadvantageously varies due to a matrix effect. In the CVD method, because an organic chemical material is used, the thin film is contaminated, and the quality of the thin film is degraded, for thus causing malfunctions of the device.

Among the many methods directed to overcoming the weak adhesive force problem between the substrate and the deposited thin film, the problem of contamination of the thin film, and the problems of non-uniformity of the thin film, a partially ionized beam deposition (PIBD) method is known as the best method in the industry. Namely, the PIBD method is directed to improving the adhesive force between the substrate and the thin film using the energy within ions by simultaneously scanning a metallic vapor and metallic self-ions in vacuum state.

Here, in the PIBD method, the most important element is the ion source which generates the metallic ions. This ion source requires the following characteristics:

1) The temperature of the crucible for the ion source should be allowed to be substantially increased for depositing various kinds of metallic ions.
2) The temperature of the crucible must be increased by using low electric power, and the ionization rate should be increased thereby as well.
3) The ion source should be able to operate stably for a long period of time, and detachment of the crucible and parts of ion source and easy maintenance should be possible in order to deal with problems such as insulation breakage caused by the deposition of metal on the depletion of the source material.
4) The uniformity of the ion beam should be high in order to enhance the reliability of the deposited thin film.

FIG. 1 is a cross-sectional view illustrating a conventional thin film deposition apparatus. As shown therein, a vacuum chamber 1 includes a crucible 2 provided for vaporizing a metallic material. An ionization section 3 is disposed therein for ionizing the vapor state metallic material, and an acceleration section 4 is disposed therein for accelerating the metal ions.

In the drawings, reference numeral 1a denotes a vacuum outlet, 2a denotes a nozzle, 5 denotes a substrate holder, 6 denotes a filter (a grid), 8 denotes an anode, 9 denotes a crucible heating filament, and 10 denotes precipitates (metallic source material).

However, the conventional metallic thin film deposition apparatus has disadvantages in that the uniformity of the ion beam is degraded, and the efficiency of the apparatus is low.

SUMMARY OF THE INVENTION

Accordingly, it is an object of the present invention to provide a thin film deposition apparatus which overcomes the aforementioned problems encountered in the conventional art.

It is another object of the present invention to provide an improved thin film deposition apparatus which allows easy increasing of the temperature of a crucible by using low electric power, for thus reducing the maintenance costs of the apparatus, and which can be used to fabricate a uniform thin film because there is very little variation of current density of the manufactured thin film device, whereby the thin film deposition apparatus has a compact structural design which allows easy maintenance and repair.

To achieve the above objects, there is provided a thin film deposition apparatus which includes a heat shielding cylindrical chamber, a cylindrical chamber arranged within the heat shielding cylindrical chamber, a crucible section including a crucible and a crucible filament arranged in an inner and lower portion of the cylindrical chamber, an ionization section having an anode and an ionization filament arranged in an upper portion inside the cylindrical chamber, and a magnet for enhancing an ionization efficiency, an upper and lower filament support for supporting the crucible filament and the ionization filament, an upper and lower flange, to which the upper and lower filaments are fixed, arranged in the cylindrical chamber in order for the upper and lower filaments to be detachable, and a grounding plate extending from the heat shielding plate and the electromagnetic field blocking cylindrical chamber located in the upper direction of the crucible section and forming an acceleration electrode system together with the upper flange.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 5 is a graph illustrating the relationship between a bombardment current variation and a crucible temperature of a thin film deposition apparatus according to the present invention;

DETAILED DESCRIPTION OF THE INVENTION

Figure 1:
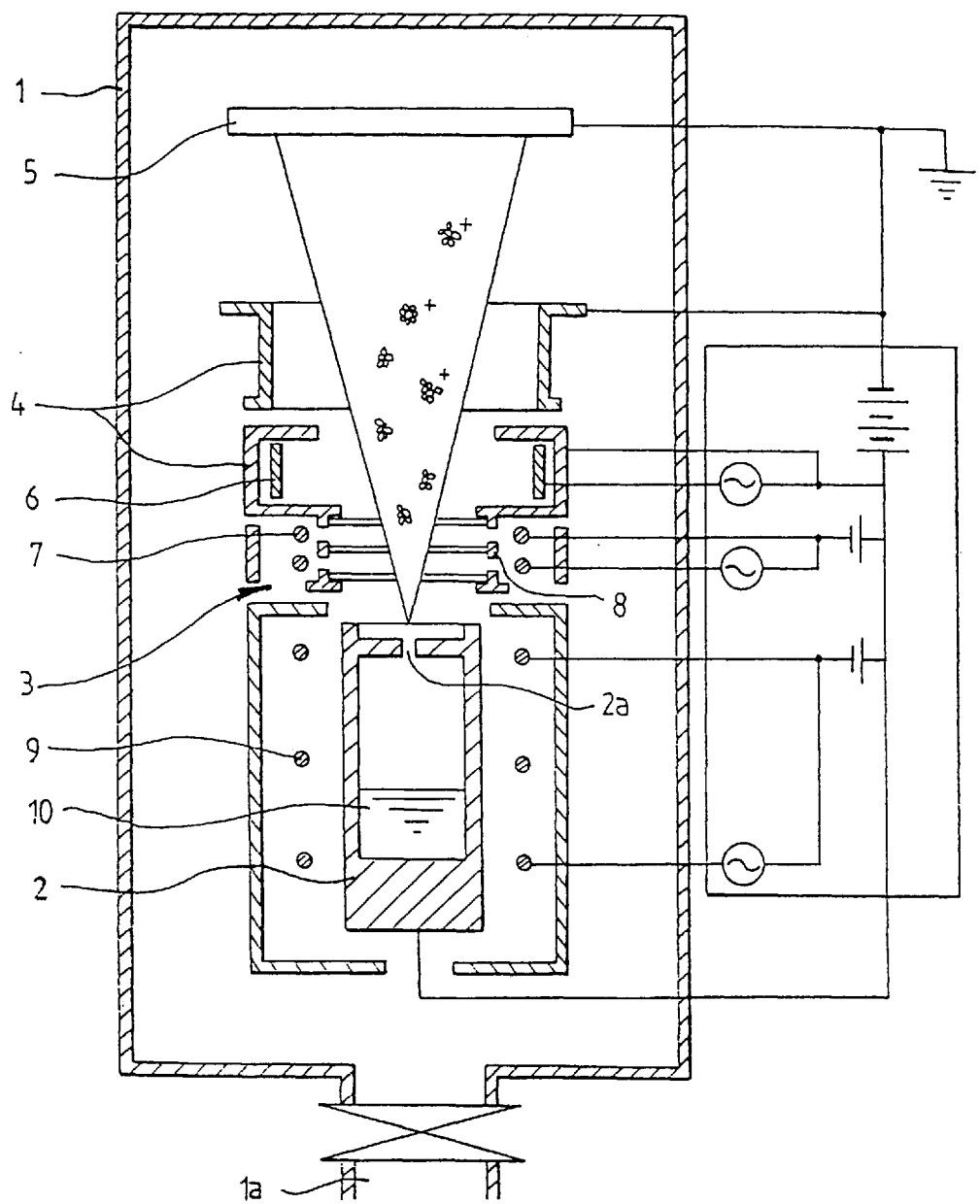
FIG. 1 is a cross-sectional view illustrating a conventional thin film deposition apparatus.
Figure 2A:
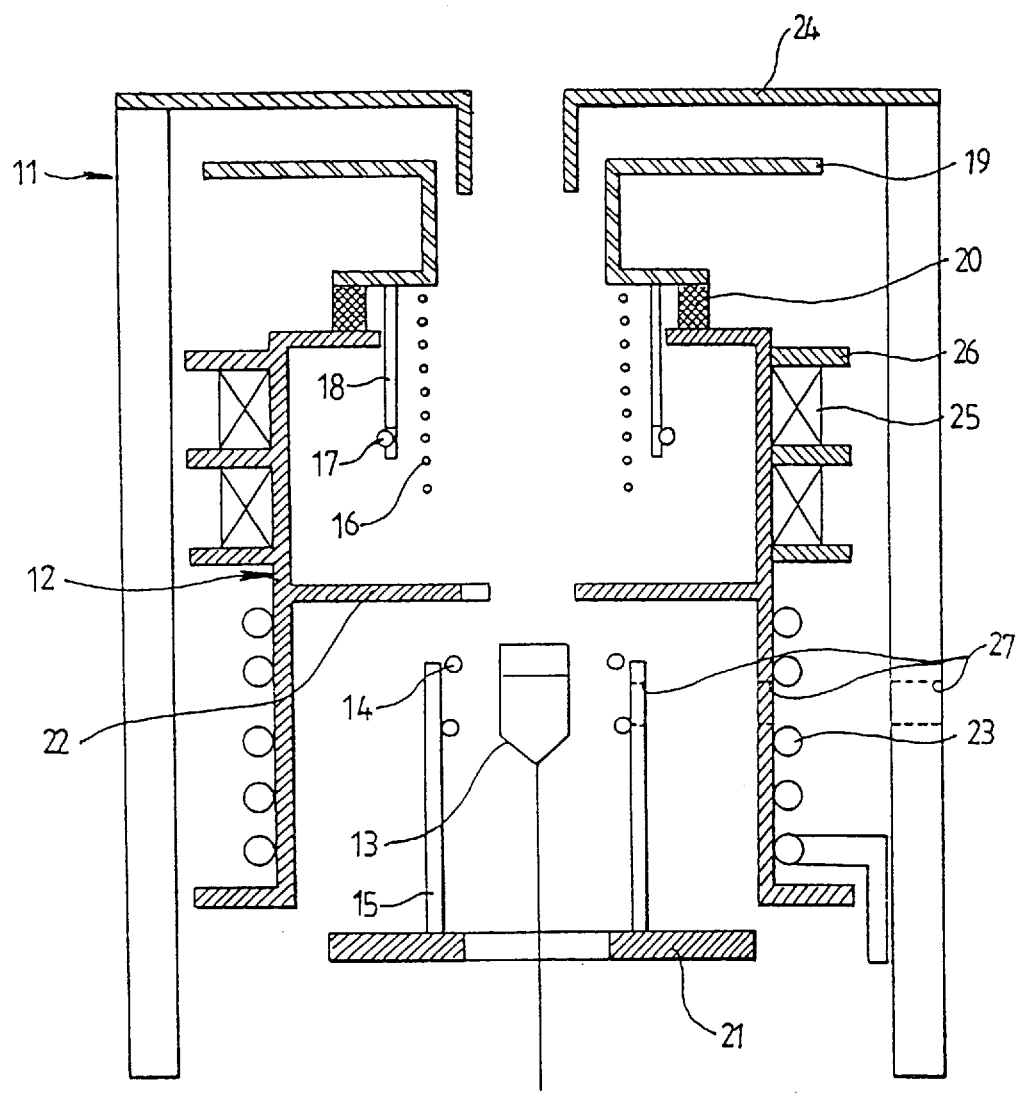
FIG. 2A is a cross-sectional view illustrating a thin film deposition apparatus according to a first embodiment of the present invention.
Figure 2B:
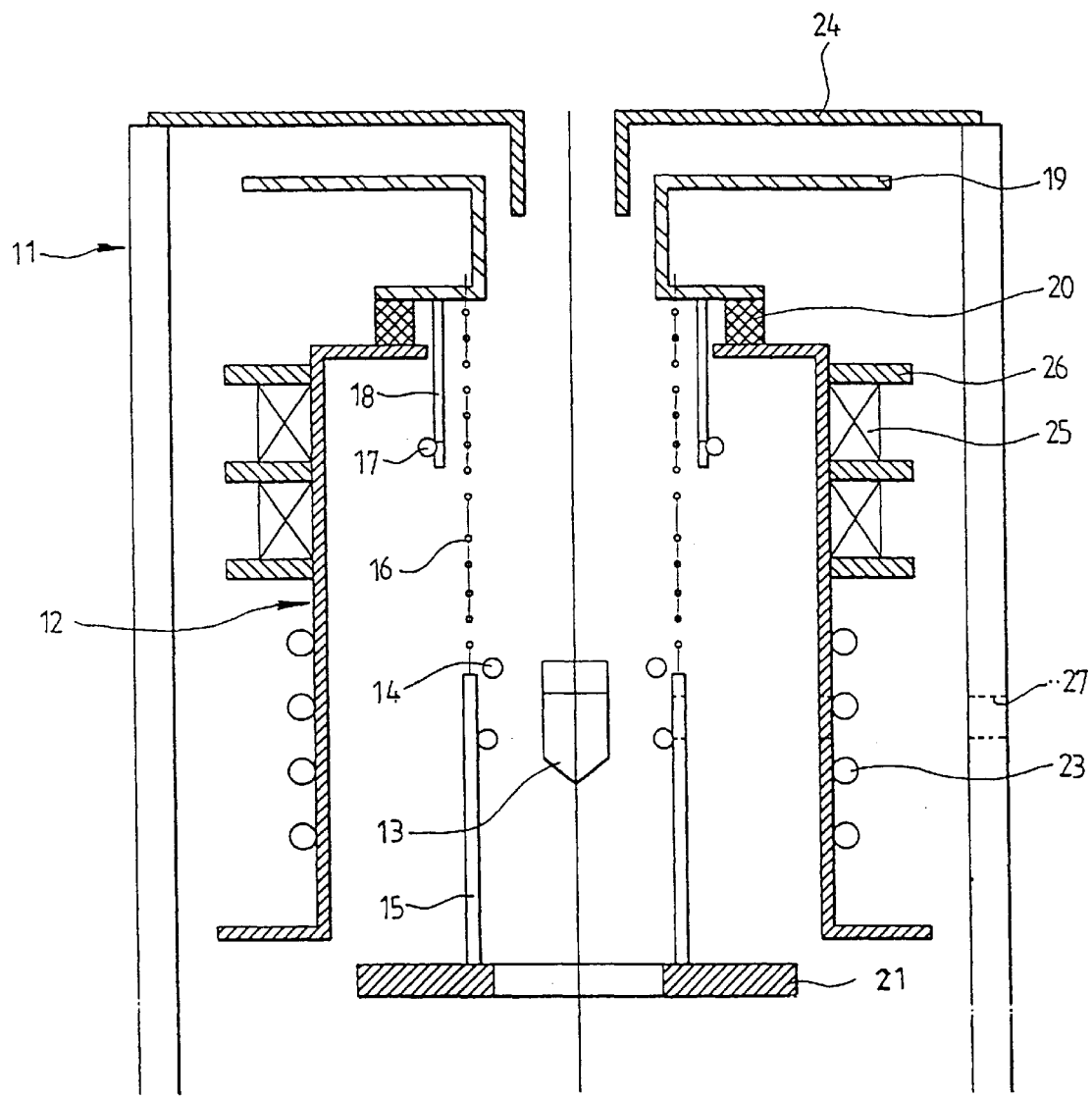
FIG. 2B is a cross-sectional view illustrating a thin film deposition apparatus according to a second embodiment of the present invention.

FIG. 2A is a cross-sectional view illustrating a thin film deposition apparatus according to a first embodiment of the present invention, and FIG. 2B is a cross-sectional view illustrating a thin film deposition apparatus according to a second embodiment of the present invention.

As shown therein, a single cylindrical chamber 12 comprises a crucible section having a crucible heating filament 14 surrounding a crucible 13 for melting a metallic material into a vapor state metal disposed within a heat shielding cylindrical; chamber 11 and an ionization section having an ionization filament 17 made of a W-Re wire for ionizing the metal in vapor state and an anode 16.

An ionization filament support 18 by which the ionization filament 17 of the ionization section is supported, is fixed to an upper flange 19 which is easily assembled onto the cylindrical chamber 12. In addition, the upper flange 19 is fixed to the cylindrical chamber 12 by an alumina insulation member 20.

The crucible heating filament support 15 is fixed to a lower flange 21 which is fixed to a lower portion of the cylindrical chamber 12.

In the apparatus according to the present invention, the crucible heating filament support 15 and the ionization filament support 18 are fixed to the upper and lower flanges 19 and 21, respectively, so that the filament arranged in the crucible section and ionization section can be easily replaced if needed.

The crucible section and ionization section are partitioned by plate 22, made of, for example, Mo or Ta which has a high melting point, so that shielding from heat and electromagnetic fields are effectively achieved therebetween. A water tube 23 is arranged at an outer portion of the crucible heating section so as to prevent the ion source from being over-heated.

Meanwhile, the acceleration electrode system according to the present invention includes the upper flange 19 fixed by the anode 16, and a ground plate 24 extending from the heat shielding cylindrical chamber 11.

The heat shielding cylindrical chamber 11 is cooled by a water coolant so as to prevent the parts from being damaged by overheating, and a temperature measuring hole 27 having a predetermined diameter is formed so as to accommodate a pyrometer to measure the temperature in the crucible.

In the drawings, reference numeral 25 denotes a magnet, and 26 denotes a magnet support.

FIG. 2B is a cross-sectional view illustrating a thin film deposition apparatus according to a second embodiment of the present invention.

Figure 3:
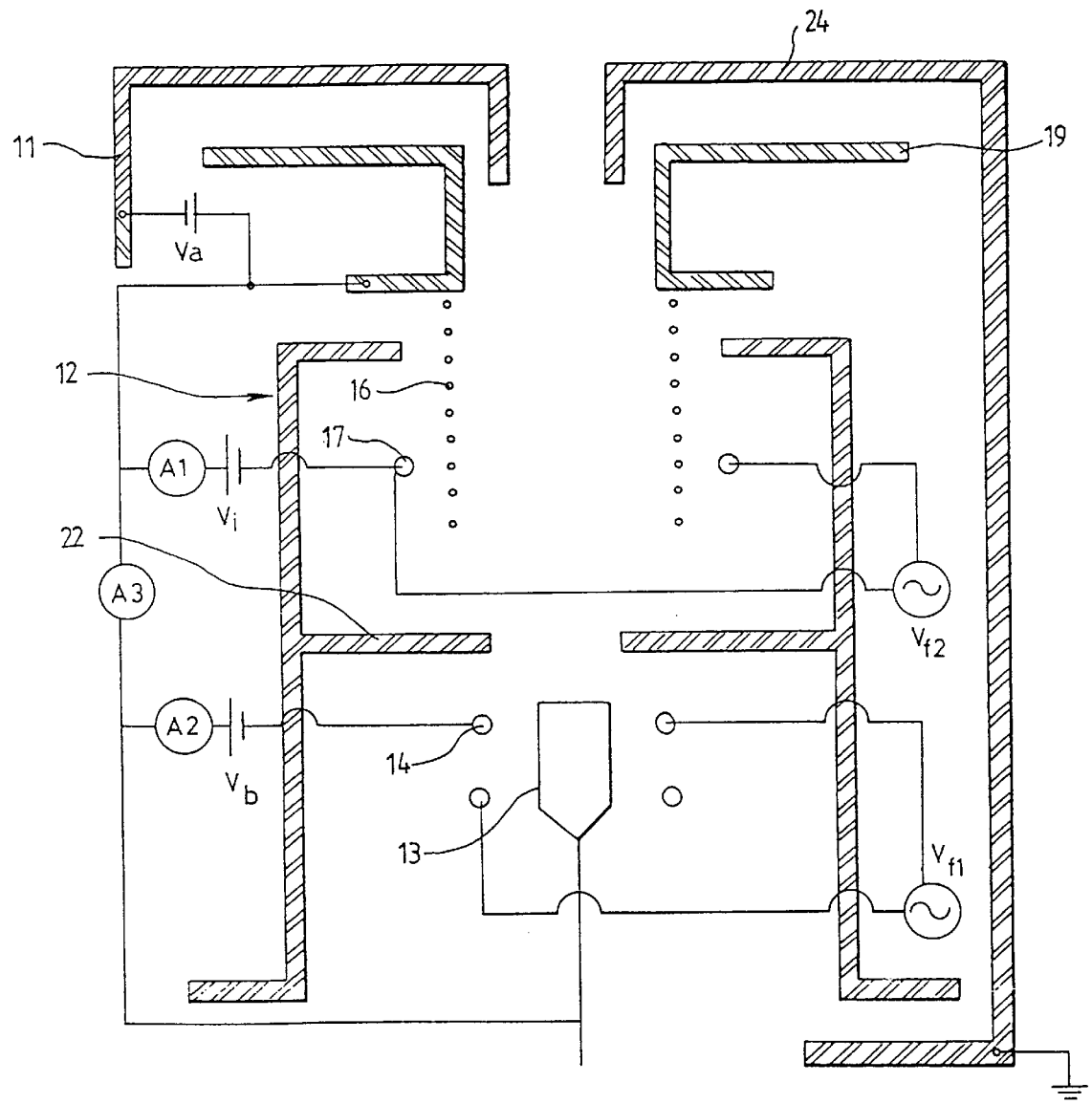
FIG. 3 is a view illustrating an electric power connection of a thin film deposition apparatus according to the present invention.

FIG. 3 is a view illustrating the electric power connection of a thin film deposition apparatus according to the present invention. As shown therein, an alternating current ($V_{f1}$: 20 V, 30 A) is applied to the crucible filament for generating thermal electrons. A direct current voltage (A2: 1000 V, 1 A) is supplied to the filament so that the electrons emitted from the crucible filament bombard the crucible.

Figure 4A:
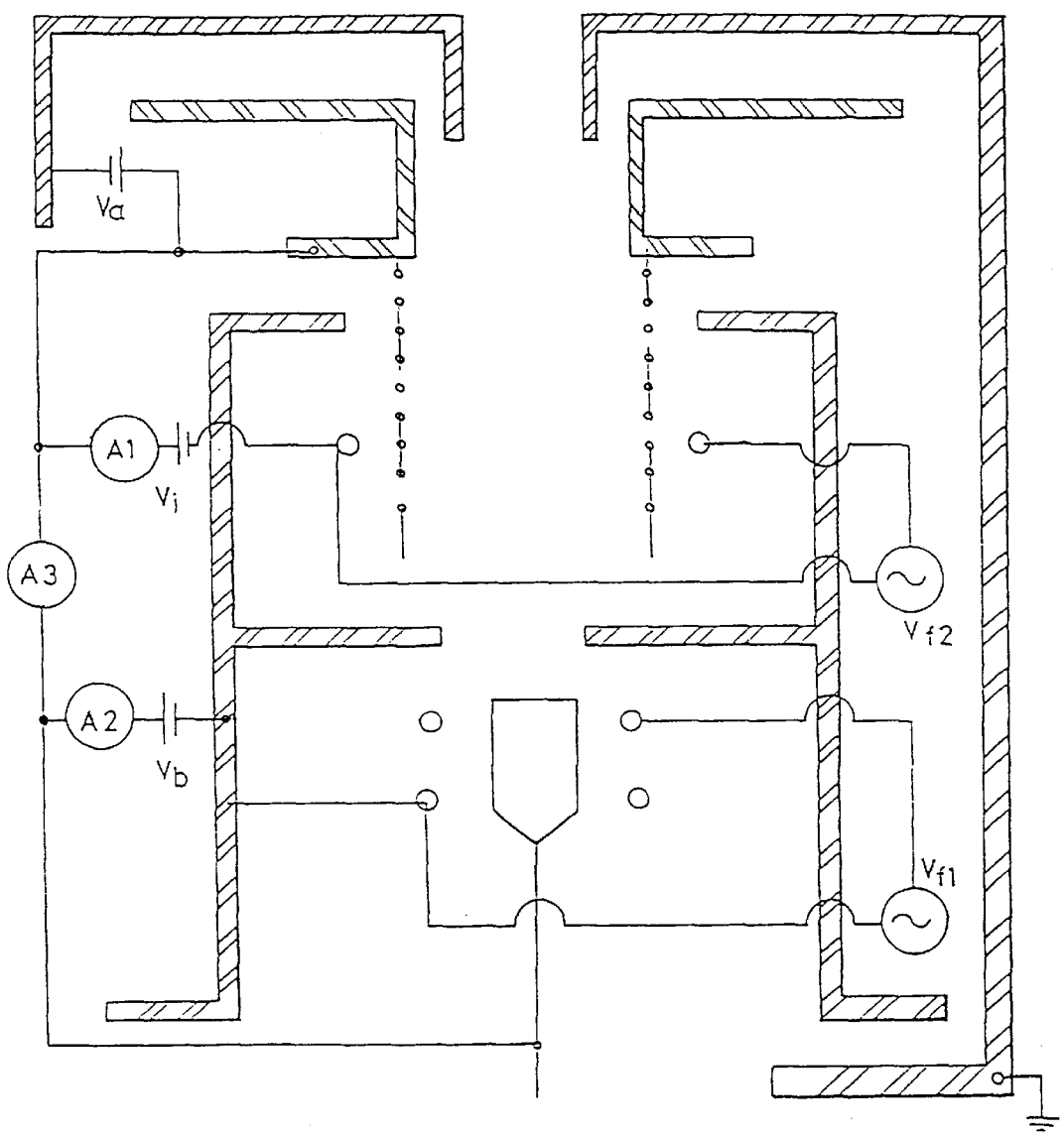
FIGS. 4A through 4C are views illustrating other electric power connections of a thin film deposition apparatus according to the present invention.
Figure 4B:
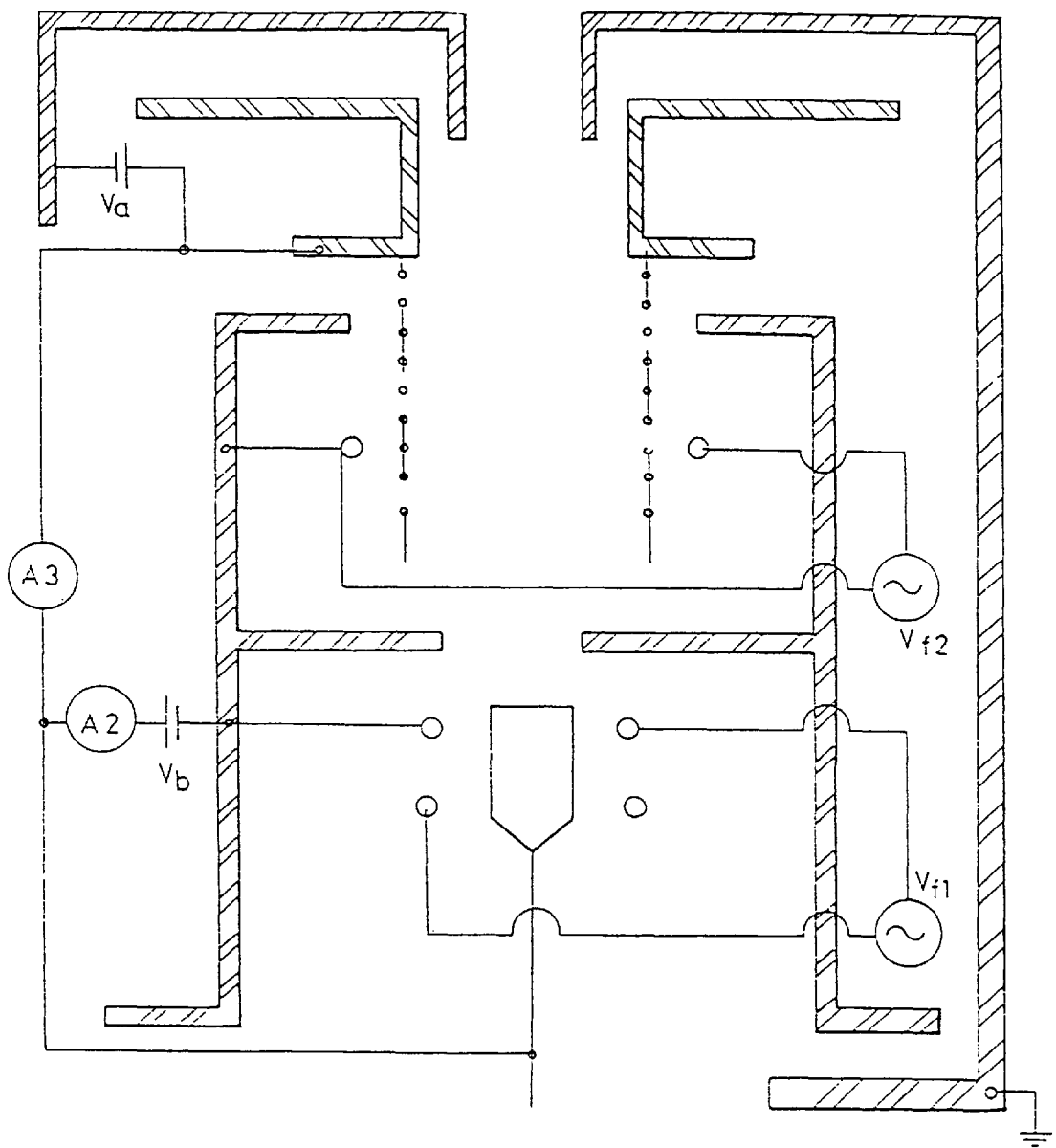
Figure 4C:
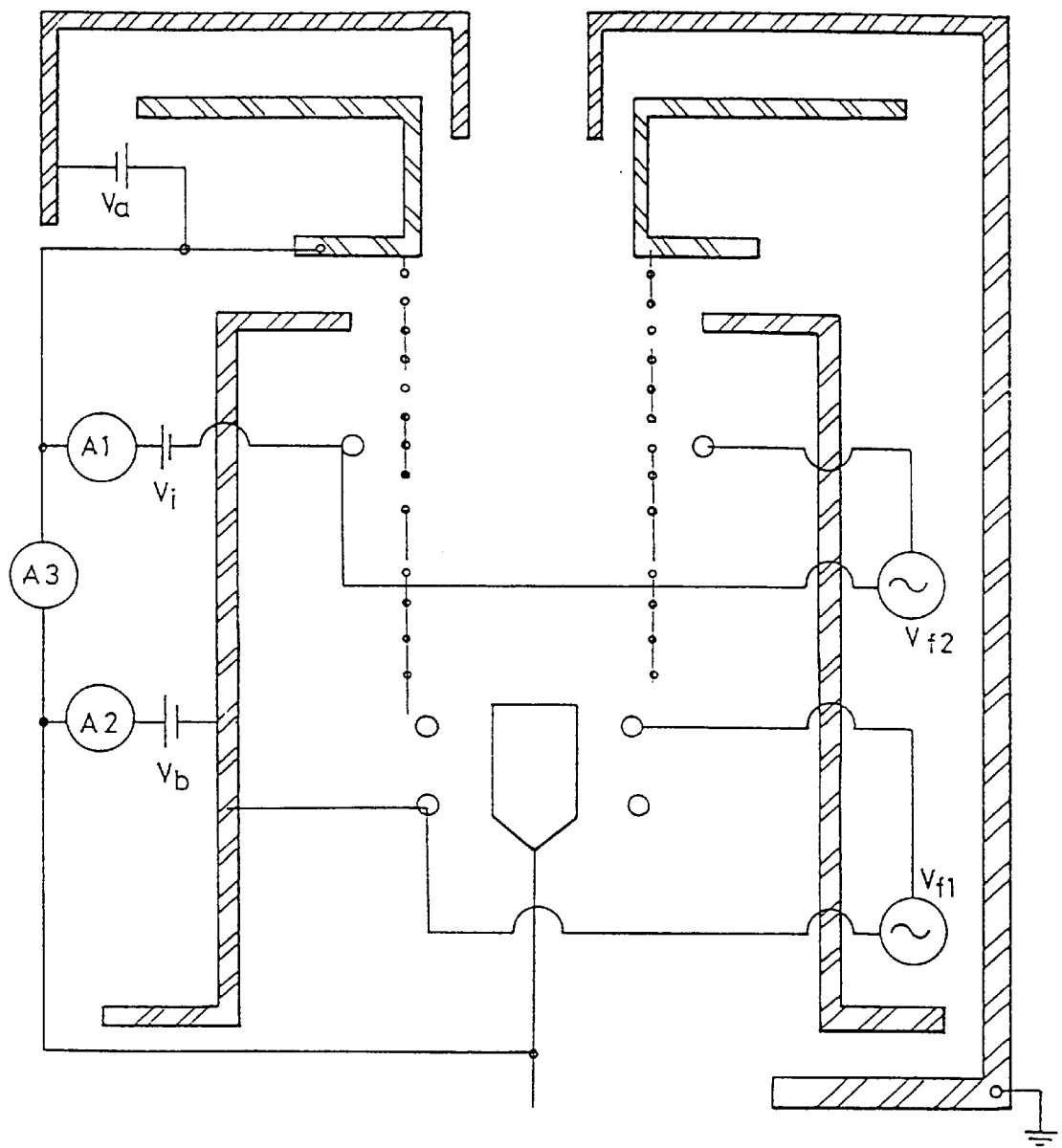

FIGS. 4A through 4C are views illustrating other electric power connections of a thin film deposition apparatus according to the present invention.

With the above-described electric power connection, it is possible to put an electric potential arrangement within the ion source, for thus generating various shapes of ion beams having a different beam profile.

In addition, thermal electrons generating (an ionization filament) alternating current ($V_{f2}$: 20 V, 30 A) is connected to the ionization filament so that metallic atoms or molecules in the vapor state from the crucible can be ionized by the bombardment of the thermal electrons. A direct current voltage (A1: 1000 V, 1 A) is supplied between the filament for ionizing the metallic atoms or molecules in vapor state by bombardment of the electrons emitted from the ionization filament to have energy. At least twelve cylindrical magnets 25 each being able to generate a maximum of 2000 Gauss are arranged in the outer portion of the cylindrical chamber 12 so as to increase the ionization efficiency.

In addition, a direct current voltage ($V_a$: 6 kV, 5 mA) is supplied between the acceleration electrode and the cathode of the ionization section so as to increase an adhesive force between the substrate and the thin film during the deposition of the thin film and to improve the quality of the thin film by generating ionized metallic atoms and molecules.

FIG. 5 is a graph illustrating the relationship between a bombardment current variation and a crucible temperature of a thin film deposition apparatus according to the present invention.

Figure 6:
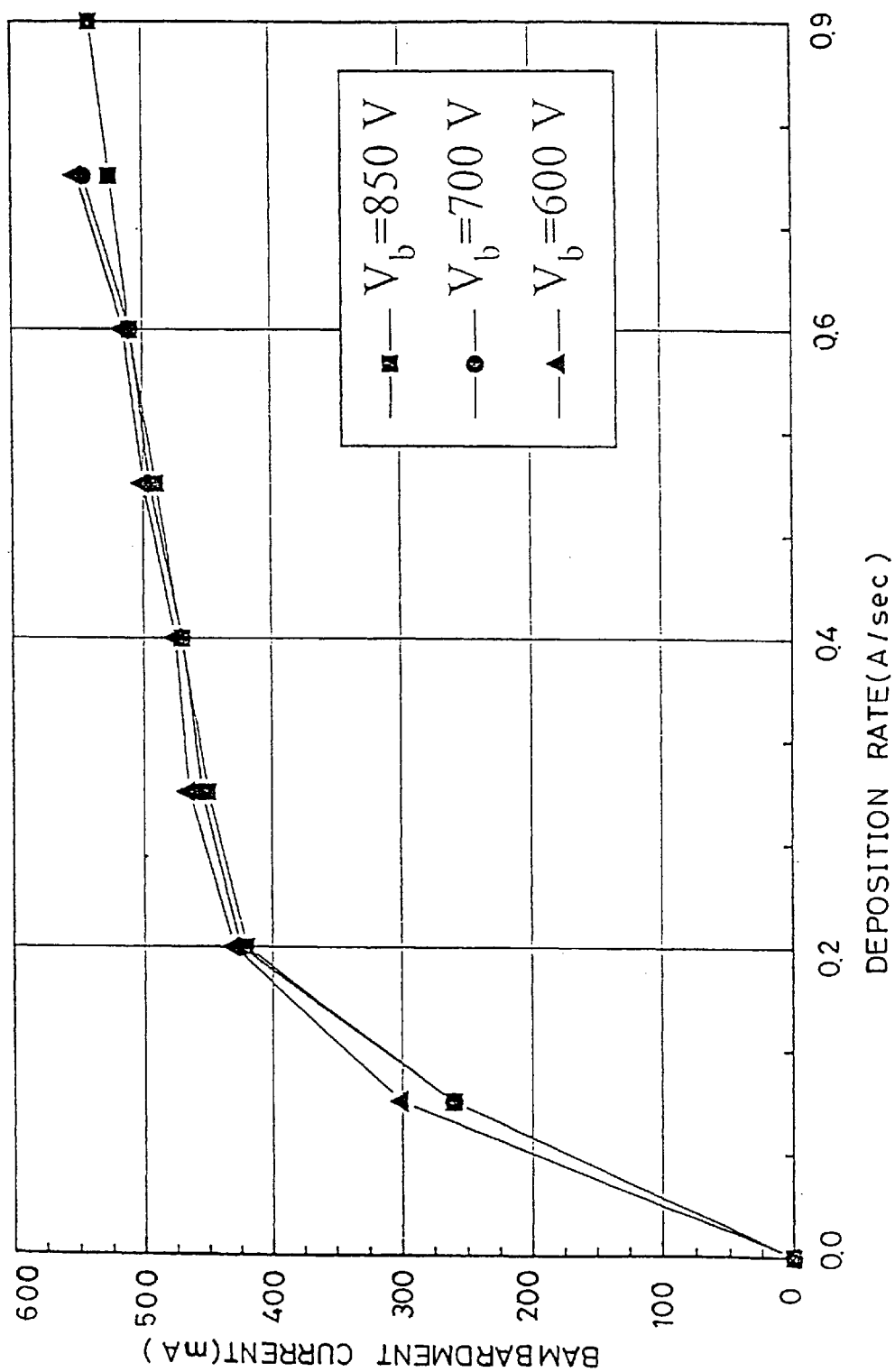
FIG. 6 is a graph illustrating the relationship between a crucible bombardment current variation and a deposition rate variation according to the present invention.

FIG. 6 is a graph illustrating the relationship between a crucible bombardment current variation and a deposition rate variation according to the present invention. As shown therein, since the temperature of the crucible is an important factor for determining the kind of metal for generating ions and the deposition rate, the temperature of the crucible is preferably increased by using low electric power.

Figure 7:
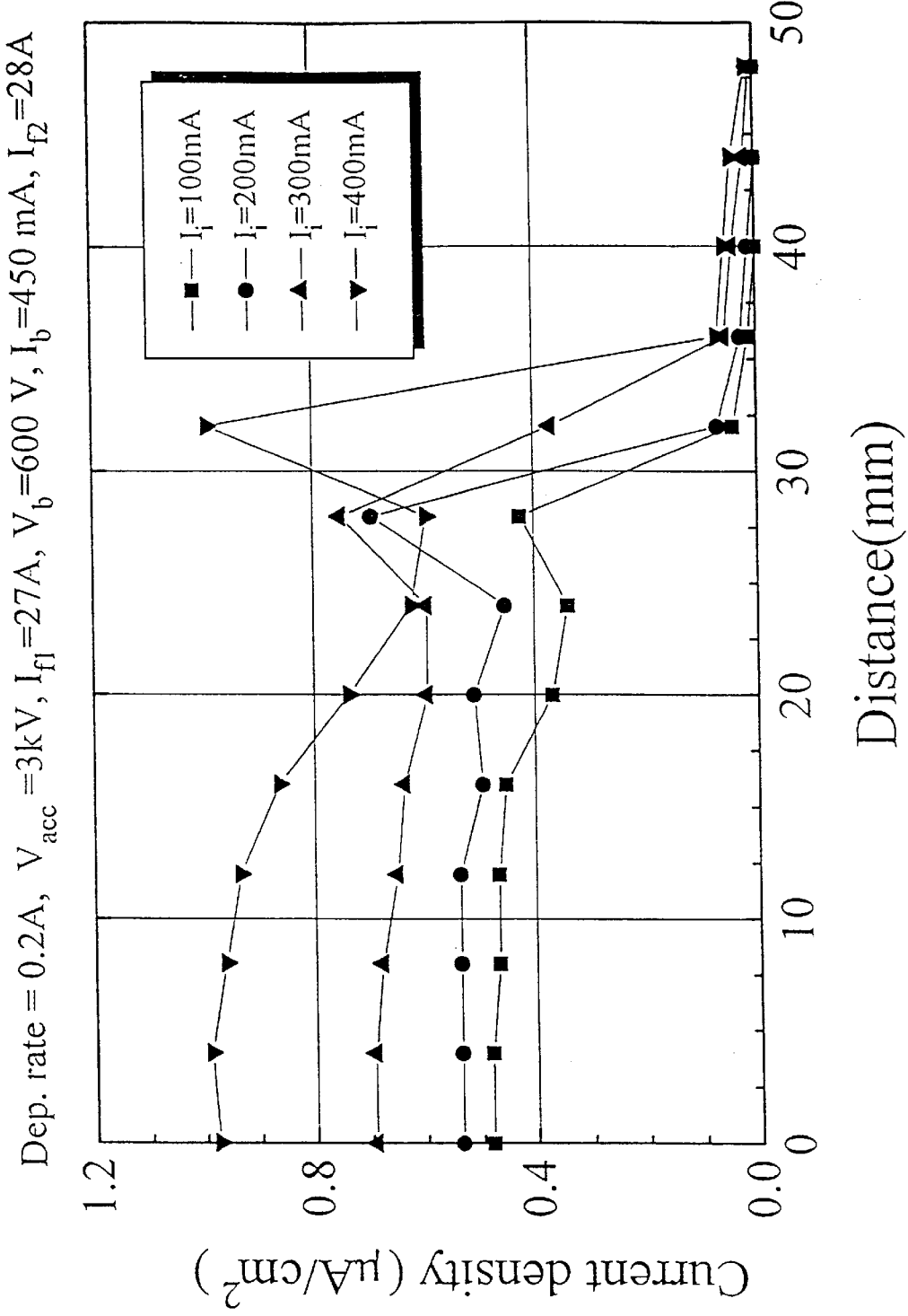
FIGS. 7 and 8 are graphs illustrating the relationship between a distance and a current density of $Cu^+$ ion by varying the conditions of an ion source of a thin film deposition apparatus as shown in FIG. 2A.
Figure 8:
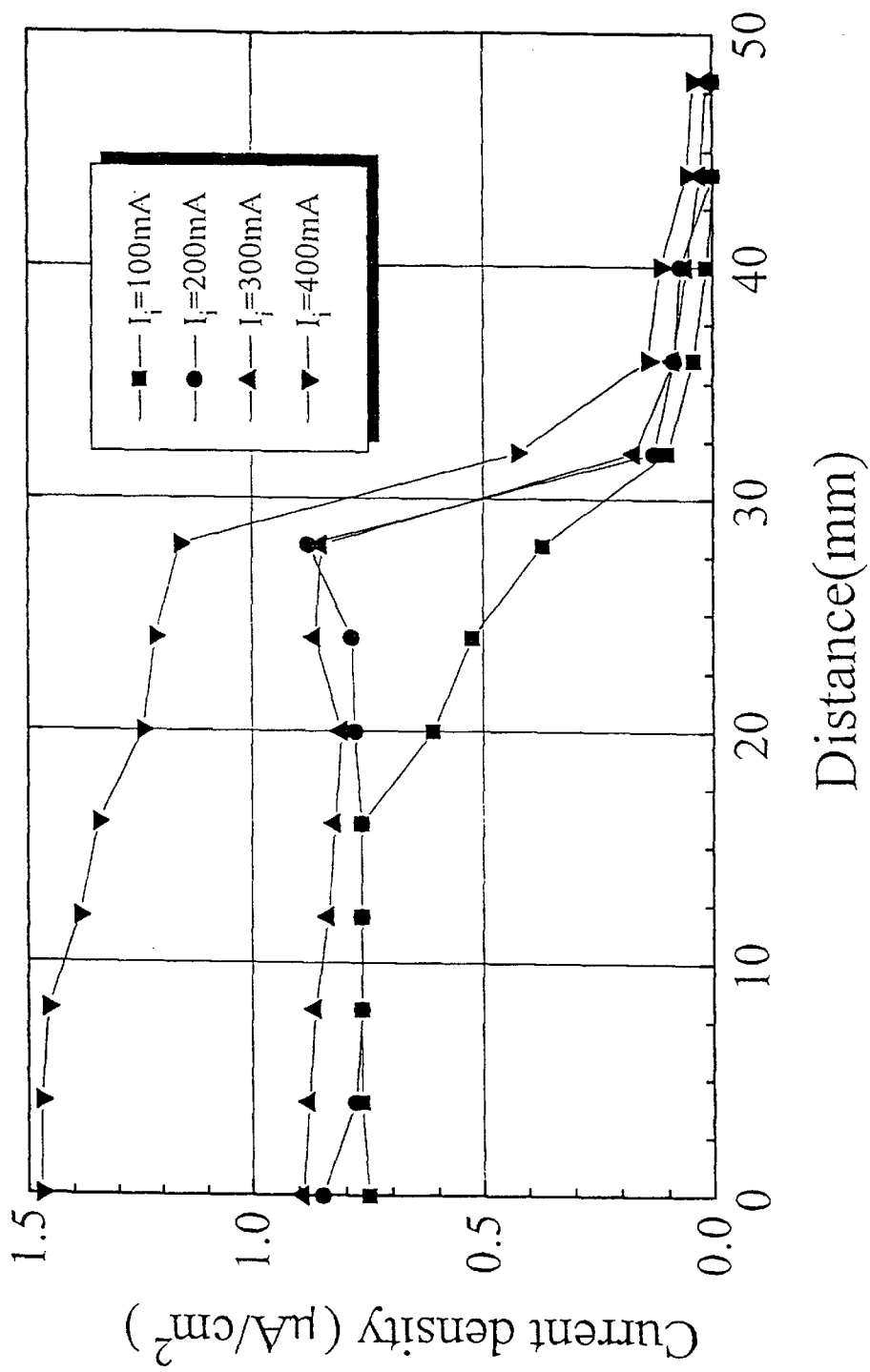

FIGS. 7 and 8 are graphs illustrating the relationship between a distance and a current density of $Cu^+$ ions by varying the conditions of an ion source of a thin film deposition apparatus as shown in FIG. 2A.

As shown therein, the current density of $Cu^+$ ions is measured based on the vertical direction by using a Faraday cup at a point that is 20 cm away from an outlet of the ion source by varying the conditions of the ion source in a state that the magnet does not exist.

Figure 9:
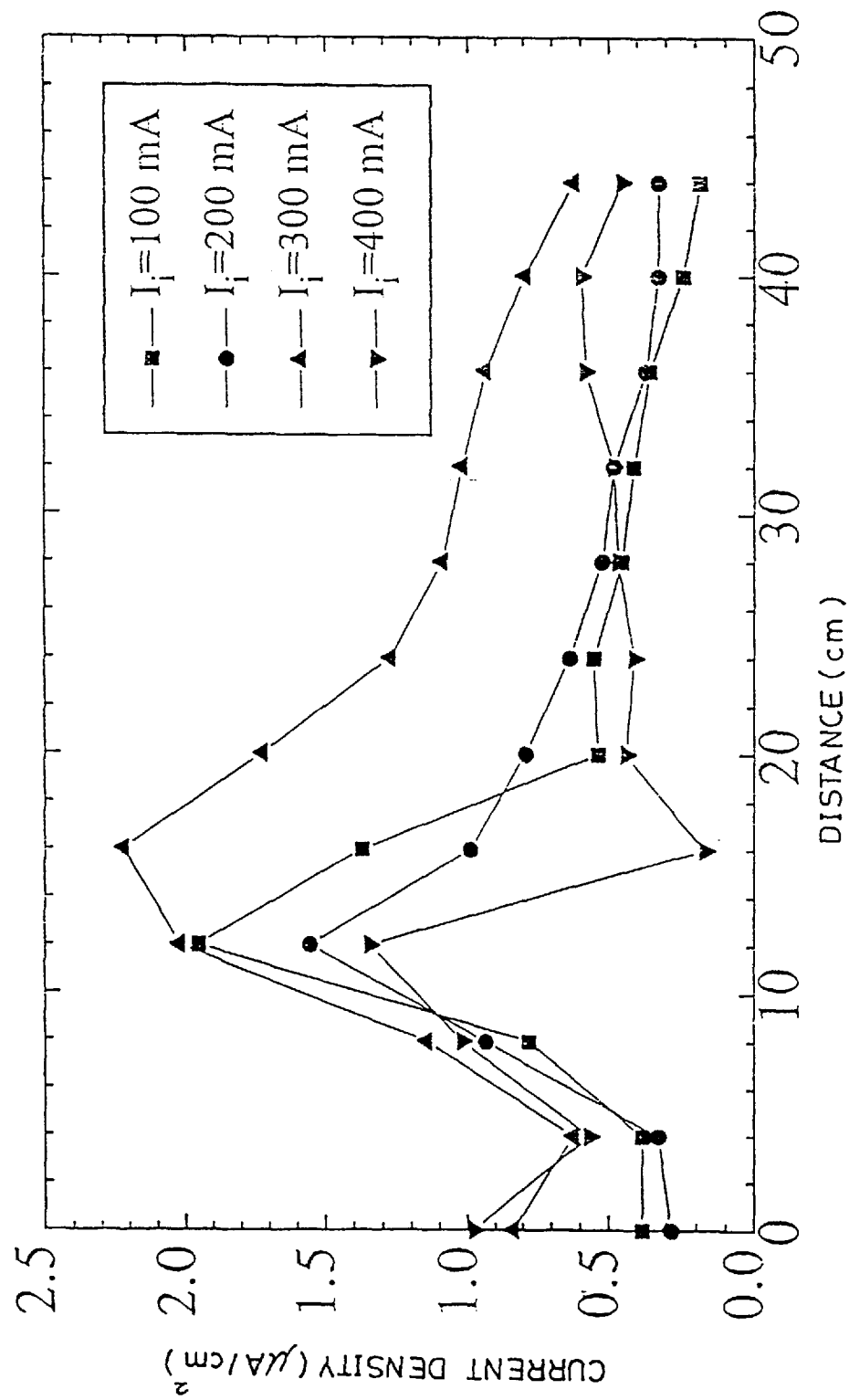
FIG. 9 is a graph illustrating a current density of $Cu^+$ ions based on the distance when a magnet of an ion source is provided according to the present invention.

FIG. 9 is a graph illustrating a current density of $Cu^+$ ions based on the distance when a magnet of an ion source is provided according to the present invention.

As a result of the experiment, the current density of $Cu^+$ ions was a maximum 2.3 $\mu A/cm^2$, and the uniformity of the current density within a diameter of 5.5 cm exceeded 95% at maximum. When additionally inserting a magnet, the ionization ratio was increased 1.6 times at maximum.

The variation of the current density based on the distance was low, and it was possible to fabricate a uniform thin film, for thus increasing the reliability of the thin film device.

Figure 10:
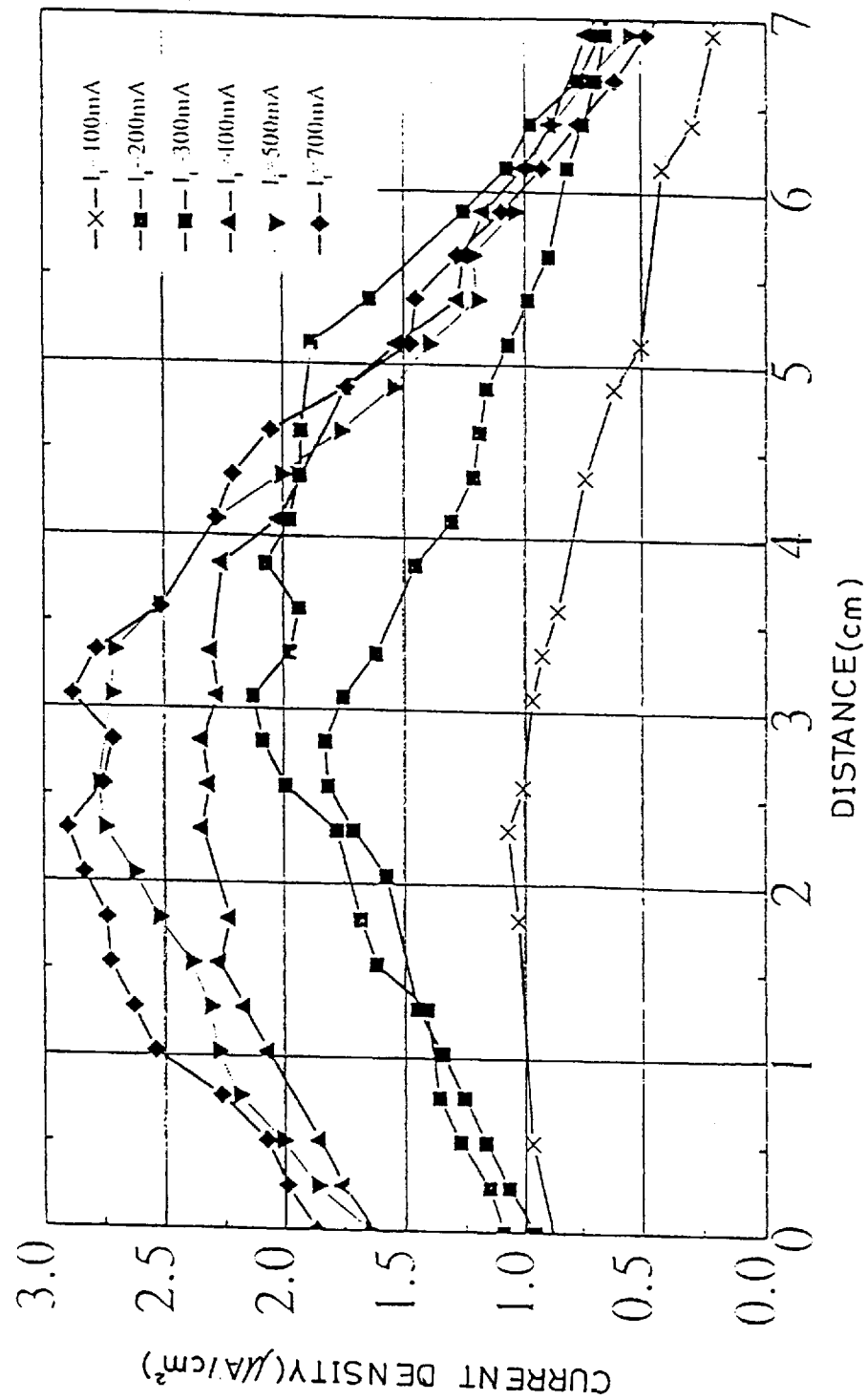
FIGS. 10 and 11 are graphs illustrating a current density of $Cu^+$ ions based on the distance by varying the condition of an ion source by a thin film deposition apparatus as shown in FIG. 2A.
Figure 11:
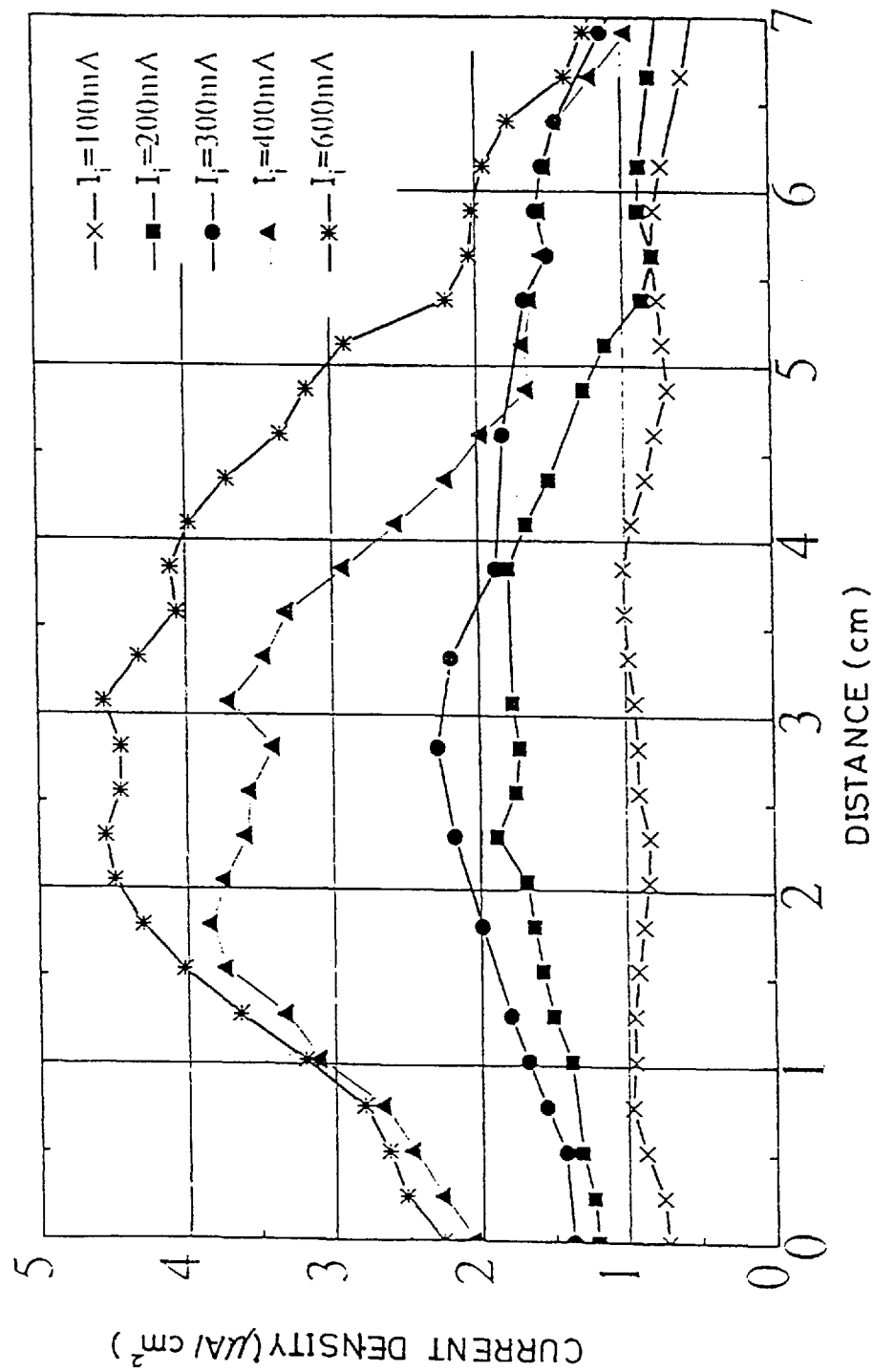

FIGS. 10 and 11 are graphs illustrating a current density of $Cu^+$ ions based on the distance by varying the condition of an ion source by a thin film deposition apparatus as shown in FIG. 2A.

As shown therein, differently from FIG. 2A, the heat shielding plate and an electromagnetic field blocking Mo plate 22 arranged at an intermediate portion of the cylindrical chamber 12 are removed so as to increase the amount of the ion generation. In addition, the length of the cathode 16 is made longer, and the electric potential inside the ion source is changed. Thereafter, the current density of $Cu^+$ ions is measured based on the vertical distance by using a Faraday cup. As shown therein, the uniformity of the ion current density was degraded, and the ion current density was 4.5 $\mu A/cm^2$ at maximum which is two times compared to the state before the structure is changed as shown in FIG. 2A.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A thin film deposition apparatus, comprising:

a heat shielding cylindrical chamber;

a cylindrical chamber located within the heat shielding cylindrical chamber;

a crucible section including a crucible and a crucible filament arranged at an inner and lower portion of the cylindrical chamber;

an ionization section having an anode and an ionization filament arranged at an upper portion inside the cylindrical chamber, and a magnet for enhancing an ionization efficiency;

an upper and lower filament support for supporting the heater filament and the ionization filament;

an upper and lower flange, to which the upper and lower filaments are fixed, arranged in the cylindrical chamber in order for the upper and lower filaments to be detachable; and a grounding plate extending from the heat shielding plate and an electromagnetic field blocking cylindrical chamber in the upper direction of the crucible section and forming an acceleration electrode system together with the upper flange.

2. The apparatus of claim 1, wherein an alumina insulation member is arranged between the cylindrical chamber and the upper flange.

3. The apparatus of claim 1, wherein said crucible section and ionization section are partitioned by a Mo plate or a Ta plate which is made of a high temperature melting material, so that heat shielding and electromagnetic field blocking can be achieved therebetween.

4. The apparatus of claim 1, wherein a water tube is arranged from the crucible heating section to the cylindrical chamber so as to prevent an ion source from being overheated.

5. The apparatus of claim 1, wherein a temperature measuring hole is formed in a lower portion of an ion source to accommodate a pyrometer to measure the temperature of the crucible.

6. The apparatus of claim 1, wherein said acceleration electrode has an inwardly deformable characteristic so as to improve the uniformity of an ion beam by changing the shape of an electric field.

7. The apparatus of claim 1, wherein said magnet is a permanent magnet or an electric magnet, which can generate 2000 Gauss at maximum, and with twelve magnets being laminated.

8. The apparatus of claim 1, wherein said filament support is made of a high temperature melting material such as Mo or Ta.

9. The apparatus of claim 1, wherein said cylindrical chamber is provided with the same electric potential as the power of the crucible or ionization filament for thus preventing the cylindrical chamber from being charged-up, so that the cylindrical chamber maintains a constant electric potential so as to obtain a uniform ion beam.

10. The apparatus of claim 1, wherein the length of the anode of the ionization section is extended in the direction of the crucible for thus increasing an ionization efficiency whereby it is possible to obtain an ion current density of a high current.

* * * * *